United States Patent
Huang et al.

(10) Patent No.: US 12,532,486 B2
(45) Date of Patent: Jan. 20, 2026

(54) CAPACITOR AND FABRICATING METHOD THEREOF

(71) Applicant: NANYA TECHNOLOGY CORPORATION, New Taipei (TW)

(72) Inventors: Chih-Hsiung Huang, Kaohsiung (TW); Ning-Shuang Hsu, Chiayi (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 504 days.

(21) Appl. No.: 18/059,952

(22) Filed: Nov. 29, 2022

(65) Prior Publication Data

US 2024/0178267 A1    May 30, 2024

(51) Int. Cl.
*H10D 1/68* (2025.01)
*H10B 12/00* (2023.01)
*H10D 1/00* (2025.01)

(52) U.S. Cl.
CPC ............ *H10D 1/696* (2025.01); *H10B 12/30* (2023.02); *H10D 1/042* (2025.01); *H10D 1/043* (2025.01); *H10D 1/714* (2025.01); *H10D 1/716* (2025.01)

(58) Field of Classification Search
CPC .............................. H10D 1/696; H10D 1/714
See application file for complete search history.

(56) References Cited

U.S. PATENT DOCUMENTS

| | | | |
|---|---|---|---|
| 2021/0273041 A1* | 9/2021 | Kang | ............... H10B 12/0335 |
| 2022/0359645 A1 | 11/2022 | Lai et al. | |
| 2024/0014252 A1* | 1/2024 | Chae | ...................... H10D 1/696 |
| 2024/0136393 A1* | 4/2024 | Kwon | ................... H10D 1/716 |

FOREIGN PATENT DOCUMENTS

TW    201419422 A    5/2014

OTHER PUBLICATIONS

Keeyoung Jun et al., "Development of TiSiN CVD process using TiCl4/SiH4/NH3 chemistry for ULSI anti-oxidation barrier applications" Science and Technology of Advanced Materials vol. 5, Sep. 11, 2004, p. 549-554, Elsevier (http://www.iop.org/journals/STAM).

* cited by examiner

*Primary Examiner* — Steven M Page
(74) *Attorney, Agent, or Firm* — CKC & Partners Co., LLC

(57) ABSTRACT

A capacitor for a memory device includes a substrate, a bottom electrode, a dielectric layer, and a top electrode. The bottom electrode includes a first bottom electrode layer and a second bottom electrode layer. The first bottom electrode layer is disposed on the substrate. The first bottom electrode layer has a cup shape. The first bottom electrode layer includes a plurality of titanium nitride layers and a plurality of silicon nitride layers that are stacked alternately. The second bottom electrode layer has a cup shape. The second bottom electrode layer includes titanium nitride. An external surface of the second bottom electrode layer contacts an internal surface of the first bottom electrode layer. The dielectric layer conformally covers an internal surface of the second bottom electrode layer. A top electrode conformally covers the dielectric layer.

7 Claims, 13 Drawing Sheets

CAPACITOR AND FABRICATING METHOD THEREOF

BACKGROUND

Technical Field

The present disclosure relates to a capacitor and a fabricating method thereof. More particularly, the present disclosure relates to a method of fabricating a bottom electrode structure for a capacitor.

Description of Related Art

Dynamic random access memories (DRAM) utilize capacitors to store data. To increase the data retention time of DRAMs, there is a need for the capacitors to increase their capacitance. As the critical dimensions of the capacitors have reduced, the increased leakage current issues have demanded the development of new capacitor geometries, new electrode materials, and new dielectric materials.

Accordingly, how to provide a method of forming a conductive layer of a semiconductor device to solve the aforementioned problems becomes an important issue to be solved by those in the industry.

SUMMARY

An aspect of the disclosure is to provide a method of forming a bottom electrode structure for a capacitor that may efficiently solve the aforementioned problems.

According to an embodiment of the disclosure, a capacitor for a memory device includes a substrate, a bottom electrode, a dielectric layer, and a top electrode. The bottom electrode includes a first bottom electrode layer and a second bottom electrode layer. The first bottom electrode layer is disposed on the substrate. The first bottom electrode layer has a cup shape. The first bottom electrode layer includes a plurality of titanium nitride layers and a plurality of silicon nitride layers that are stacked alternately. The second bottom electrode layer has a cup shape. The second bottom electrode layer includes titanium nitride. An external surface of the second bottom electrode layer contacts an internal surface of the first bottom electrode layer. The dielectric layer conformally covers an internal surface of the second bottom electrode layer. A top electrode conformally covers the dielectric layer.

In an embodiment of the disclosure, the dielectric layer further conformally covers a top surface and an external surface of the bottom electrode.

In an embodiment of the disclosure, the top electrode conformally covers a top surface and an external surface of the bottom electrode.

In an embodiment of the disclosure, the top electrode includes titanium nitride.

In an embodiment of the disclosure, a ratio of a thickness of the first bottom electrode layer and a thickness of the second bottom electrode layer is in a range from about 0.3 to about 1.2.

In an embodiment of the disclosure, a total thickness of the plurality of titanium nitride layers is larger than a total thickness of the plurality of silicon nitride layers.

In an embodiment of the disclosure, one of the titanium nitride layers is disposed between and in contact with two of the silicon nitride layers.

According to another embodiment of the disclosure, a method of fabricating a capacitor includes: forming a mold over a substrate; removing a portion of the mold to form an opening exposing a portion of the substrate; depositing a plurality of titanium nitride layers and a plurality of silicon nitride layers alternately and conformally in the opening to form a bottom electrode, in which the bottom electrode includes an inner portion and an outer portion, the inner portion has an internal surface opposite to the out portion, the outer portion has an external surface opposite to the inner portion, and a top surface connects the internal surface and the external surface, and in which the plurality of silicon nitride layers is disposed in the outer portion; removing the mold.

In an embodiment of the disclosure, the method further includes removing excess portions of the bottom electrode until a top surface of the mold is exposed.

In an embodiment of the disclosure, the method further includes: depositing a dielectric layer conformally covering the internal surface of the bottom electrode; depositing a top electrode conformally covering the dielectric layer.

In an embodiment of the disclosure, the depositing the dielectric layer includes depositing the dielectric layer conformally covering the top surface and the external surface of the bottom electrode.

In an embodiment of the disclosure, the top electrode includes titanium nitride.

In an embodiment of the disclosure, a ratio of a thickness of the outer portion of the bottom electrode and a thickness of the inner portion of the bottom electrode is between about 0.3 and about 1.2.

In an embodiment of the disclosure, a total thickness of the plurality of titanium nitride layers is larger than a total thickness of the plurality of silicon nitride layers.

In an embodiment of the disclosure, the mold includes silicon oxide.

Accordingly, in the capacitor and its fabricating method of the present disclosure, by adding SiN layers to the outer portion of the cup-shaped bottom electrode, the etch resistance of the outer portion is higher than that of the inner portion. Therefore, when undergoing etching processes during the fabrication, the outer radius of the bottom electrode remains and the inner radius of the bottom electrode increases. As such, the contact areas of the bottom electrode with the dielectric layer either remain at their maximum or increase. Hence, a capacitor with higher capacitance while maintaining the same leakage current may be accomplished.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
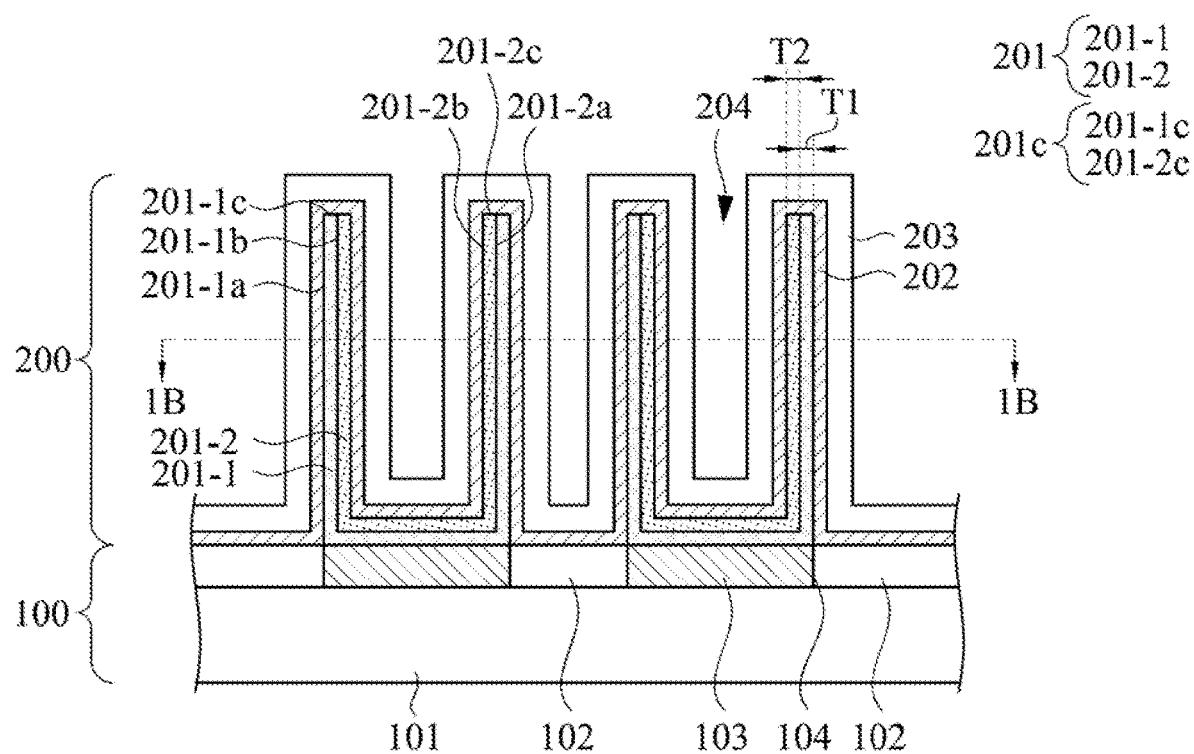
FIG. 1A is a partial cross-sectional view of a capacitor according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 1B:
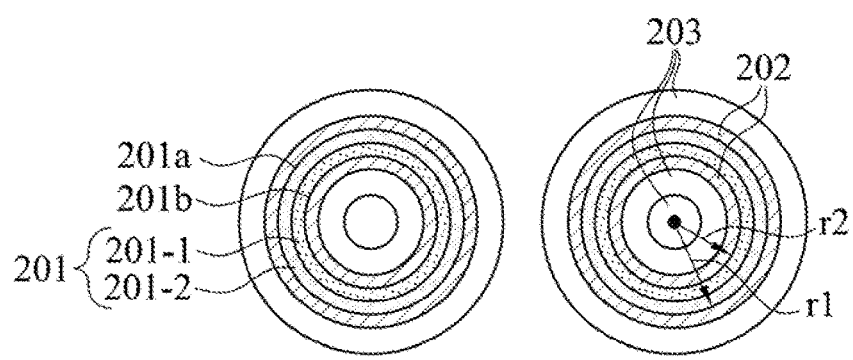
FIG. 1B is a partial cross-sectional view of the capacitor taken along the line 1B-1B of FIG. 1A according to an embodiment of the present disclosure.

Reference is made to FIG. 1A and FIG. 1B. FIG. 1A is a partial cross-sectional view of a capacitor 200 according to an embodiment of the present disclosure. FIG. 1B is a partial cross-sectional view of the capacitor 200 taken along the line 1B-1B of FIG. 1A according to an embodiment of the present disclosure. As shown in FIG. 1A and FIG. 1B, a capacitor 200 is formed on a substrate 100. The substrate 100 may be a semiconductor substrate. For example, the substrate 100 may include a semiconductor wafer 101, an interlayer dielectric 102, and contact pads 103, as shown in FIG. 1A. The interlayer dielectric 102 overlies the semiconductor wafer 101. The contact pads 103 are disposed in contact holes 104, which are defined in the interlayer dielectric 102.

The capacitor 200 includes a bottom electrode 201, a dielectric layer 202, and a top electrode 203. The bottom electrode 201 is formed to be cup-shaped. The bottom electrode 201 includes an outer portion and an inner portion. The outer portion and the inner portion are cup-shaped. The inner portion is disposed in and in contact with the outer portion. In the following paragraphs, the outer portion is referred to as the first bottom electrode layer 201-1 and the inner portion is referred to as the second bottom electrode layer 201-2, as shown in FIG. 1A. The first bottom electrode layer 201-1 is disposed on the contact pad 103. The first bottom electrode layer 201-1 includes titanium nitride (TiN) and silicon nitride (SiN). More particularly, the first bottom electrode layer 201-1 includes a TiN—SiN nanostructure. The composition of the TiN-SiN nanostructure will be described in detail in the following paragraph.

As described above, the second bottom electrode layer 201-2 is disposed in and in contact with the first bottom electrode layer 201-1. To be more specific, the cup-shaped first bottom electrode layer 201-1 has an external surface 201-1a and an internal surface 201-1b. The cup-shaped second bottom electrode layer 201-2 has an external surface 201-2a and an internal surface 201-2b. As shown in FIG. 1A, the internal surface 201-1b and the external surface 201-2a are in direct contact. The second bottom electrode layer 201-2 includes TiN.

As shown in FIG. 1A, the first bottom electrode layer 201-1 has a thickness T1. The second bottom electrode layer 201-2 has a thickness T2. In some embodiments, the ratio of the thickness T1 and the thickness T2 is in a range from about 0.3 to about 1.2. For example, the ratio of the thickness T1 and the thickness T2 is about 1, as shown in FIG. 1A. A combination of the first bottom electrode layer 201-1 and the second bottom electrode layer 201-2 is referred to as the bottom electrode 201.

The external surface 201-1a is referred to as an external surface 201a of the bottom electrode 201 (referring to FIG. 1B). The internal surface 201-2b is referred to as an internal surface 201b of the bottom electrode 201 (referring to FIG. 1B).

Also, referring back to FIG. 1A, the first bottom electrode layer 201-1 has a top surface 201-1c and the second bottom electrode layer 201-2 has a top surface 201-2c. A combination of the top surface 201-1c and the top surface 201-2c is referred to as a top surface 201c of the bottom electrode 201.

In some embodiments, the dielectric layer 202 is disposed to conformally cover the internal surface 201b. The thickness of the dielectric layer 202 is chosen such that there is an opening 204 left to make the dielectric layer 202 cup-shaped. The dielectric layer 202 includes high-k dielectric materials.

The top electrode 203 is disposed to conformally cover the dielectric layer 202. The thickness of the top electrode 203 is chosen such that the opening 204 is not filled and thus the top electrode 203 is cup-shaped. In some embodiments, the top electrode 203 includes TiN. The bottom electrode 201 and the top electrode 203 are electrically insulated by the dielectric layer 202. As such, the capacitor 200 is a single-sided metal-insulator-metal (MIM) capacitor.

In an exemplary embodiment, as shown in FIG. 1A and FIG. 1B, the dielectric layer 202 further conformally covers the top surface 201c and the external surface 201a of the bottom electrode 201. Also, the top electrode 203 further conformally covers the top surface 201c and the external surface 201a of the bottom electrode 201. The top electrode 203 is disposed to conformally cover the dielectric layer 202 as well, as shown in FIG. 1A. As such, the capacitor 200 is a double-sided MIM capacitor.

In some embodiments of the present disclosure, to improve the retention time of memory devices while maintaining the leakage current, the capacitance of the capacitor 200 is increased by enlarging the contact area of the bottom electrode 201 which contacts the dielectric layer 202. That is to say, the inner radius r2 and the outer radius r1 of the bottom electrode 201 shown in FIG. 1B are preferably larger.

During the fabrication of the capacitor 200, the bottom electrode 201 may undergo etching processes. Since TiN is easily oxidized and forms titanium oxynitride (TiON), which may be easily etched away, the inner radius r2 may become larger and the outer radius r1 may become smaller after the etching processes. To achieve as large radii as possible, the outer radius r1 is expected to remain while it is acceptable that the inner radius r2 is enlarged by etching. Therefore, it is expected that the first bottom electrode layer 201-1 has higher etch resistance than the second bottom electrode layer 201-2.

To increase the etch resistance of the first bottom electrode layer 201-1, silicon (Si) is introduced to TiN. Ternary metal nitride, such as TiSiN, possesses some improved properties. For example, ternary metal nitride has good etch resistance and high anti-oxidation performance, compared to binary metal nitride.

Figure 1C:
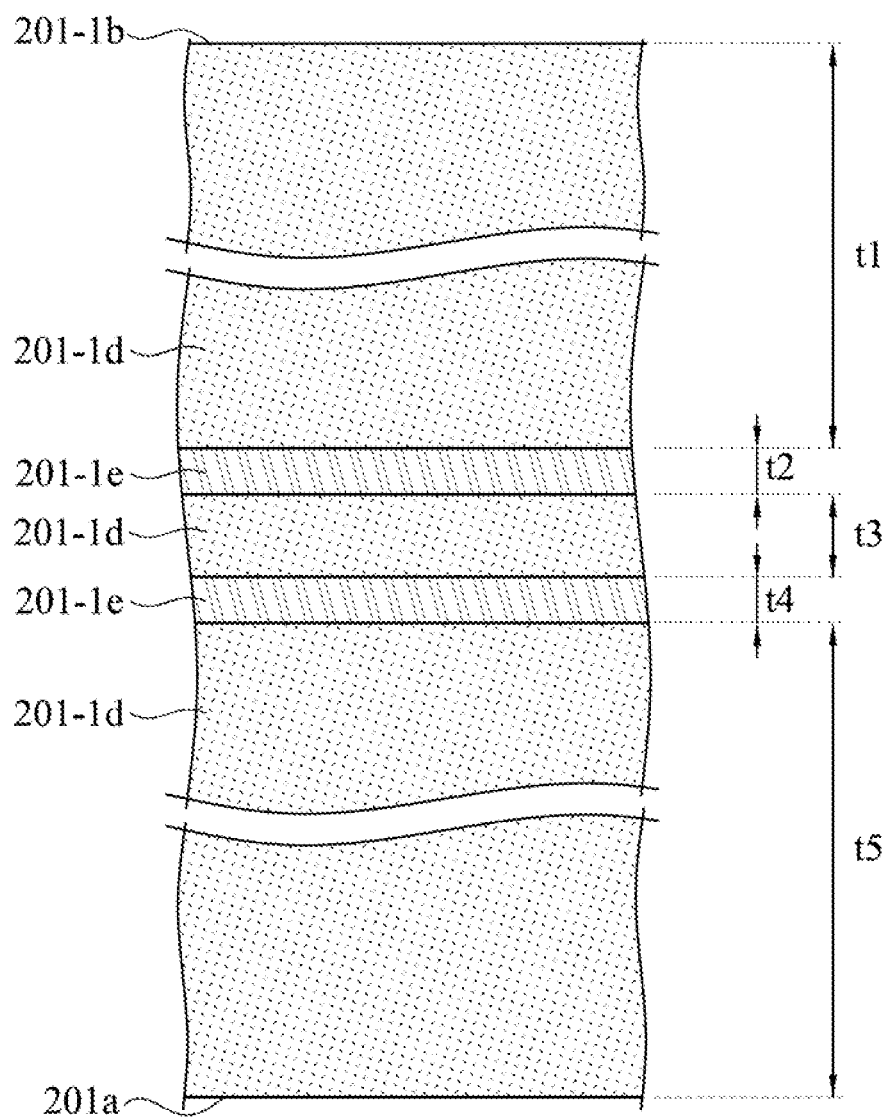
FIG. 1C is a detailed partial cross-sectional view of the first bottom electrode layer according to an embodiment of the present disclosure.

Therefore, in some embodiments of the present disclosure, Si is added to the first bottom electrode layer 201-1 through a TiN—SiN nanostructure. The TiN—SiN nanostructure includes TiN layers and SiN layers stacked alternately. Reference is made to FIG. 1C. FIG. 1C is a detailed partial cross-sectional view of the first bottom electrode layer 201-1 according to an embodiment of the present disclosure. As shown in FIG. 1C, the layers 201-1d are TiN layers. The layers 201-1e are SiN layers. In an exemplary embodiment, one of the TiN layers 201-1d is disposed between and in contact with two of the SiN layers 201-1e.

In some embodiments, the total thickness of the TiN layers 201-1d is larger than the total thickness of the SiN layers 201-1e. More particularly, the sum of thicknesses t1, t3, and t5 of the TiN layers 201-1d is larger than the sum of thicknesses t2 and t4 of the SiN layers 201-1e. In some embodiments, the ratio of the thicknesses of the TiN layers 201-1d and the SiN layers 201-1e, i.e., t1:t2:t3:t4:t5, is about 259:2:4:2:64.

Figure 2:
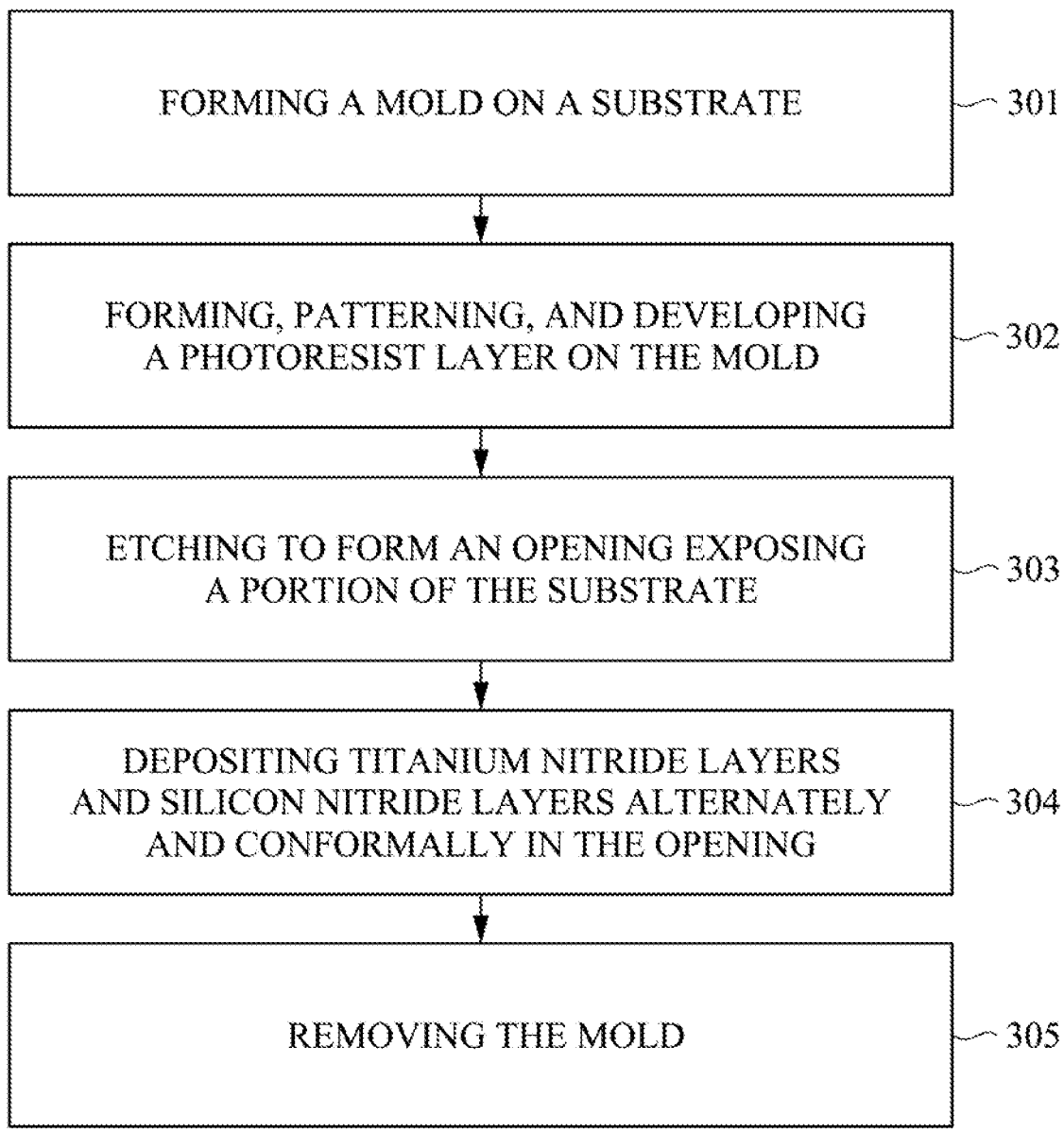
FIG. 2 is a flow chart of a method for fabricating a capacitor according to an embodiment of the present disclosure.

Reference is made to FIG. 2. FIG. 2 is a flow chart of method 300 for fabricating a capacitor 200 according to an embodiment of the present disclosure. As shown in FIG. 2, method 300 involves operation 301 of forming a mold 205 over a substrate 100 (referring to FIG. 3A). Next, method 300 proceeds to operation 302 of forming, patterning, and developing a photoresist layer 206 on the mold 205 (referring to FIG. 4A). Method 300 then includes operation 303 of etching the mold 205 to form an opening 204 exposing a portion of the substrate 100 (referring to FIG. 5A). Next, method 300 further involves operation 304 of depositing TiN layers and SiN layers alternately and conformally in the opening 204 (referring to FIG. 6A and FIG. 7A). Moreover, method 300 removes the mold 205 in operation 305 (referring to FIG. 10A).

Figure 3A:
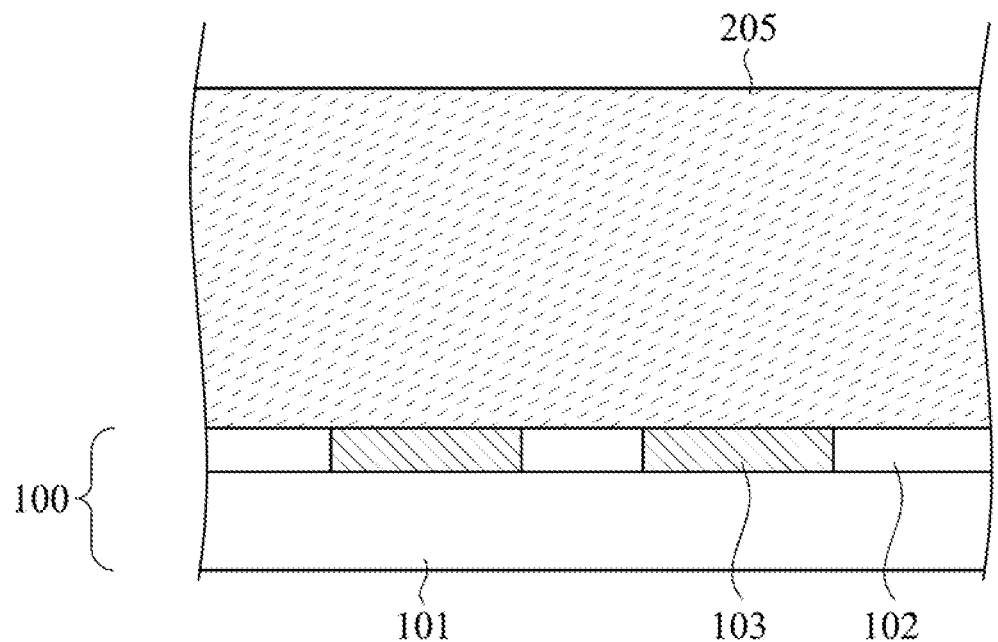
FIG. 3A is a partial cross-sectional view of an intermediate stage of a method according to an embodiment of the present disclosure.
Figure 3B:
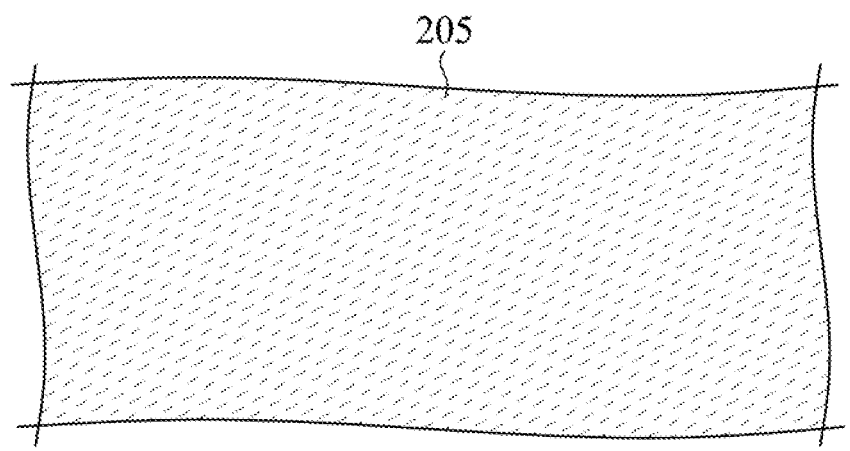
FIG. 3B is a top view of an intermediate stage of a method according to an embodiment of the present disclosure.

Reference is made to FIG. 3A and FIG. 3B. FIG. 3A and FIG. 3B are a partial cross-sectional view and a top view of an intermediate stage of method 300 in FIG. 2 according to an embodiment of the present disclosure, respectively. As shown in FIG. 3A and FIG. 3B, after operation 301, a mold 205 is formed on a substrate 100. As described above, the substrate 100 is a semiconductor substrate including a semiconductor wafer 101, an interlayer dielectric 102, and contact pads 103. The interlayer dielectric 102 includes a dielectric substance. For example, the interlayer dielectric 102 may include a nitride, such as SiN. The mold 205 includes a substance with a high etching selectivity with respect to the interlayer dielectric 102. Also, the mold 205 includes a substance that may be easily removed through wet etching. For example, the mold 205 may include an oxide, such as silicon oxide ($SiO_2$). In other embodiments, the mold 205 may include a multi-layered oxide. For example, the mold 205 may include boron phosphorus silicate glass (BPSG), undoped silicon glass (USG), phosphosilicate glass (PSG), or the like.

Figure 4A:
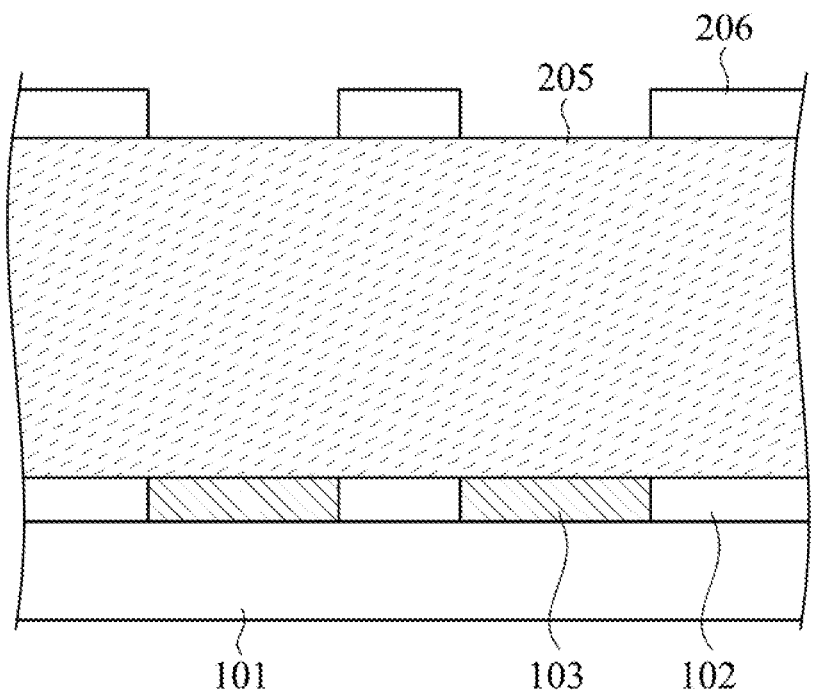
FIG. 4A is a partial cross-sectional view of an intermediate stage of a method according to an embodiment of the present disclosure.
Figure 4B:
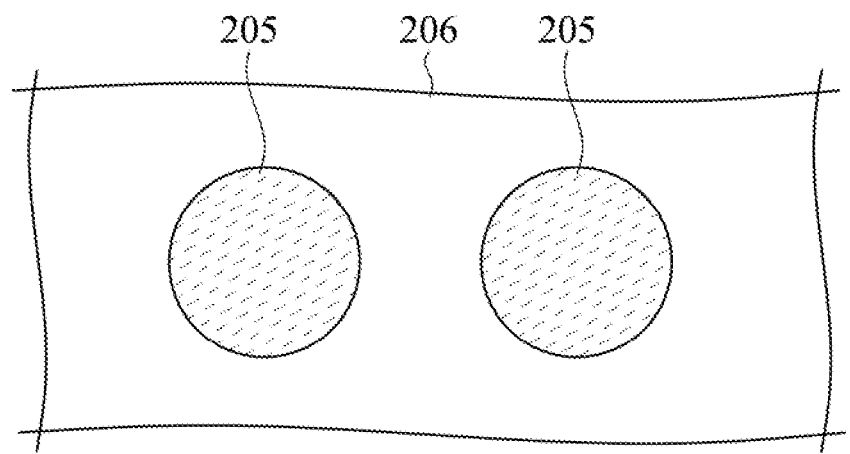
FIG. 4B is a top view of an intermediate stage of a method according to an embodiment of the present disclosure.

Reference is made to FIG. 4A and FIG. 4B. FIG. 4A and FIG. 4B are a partial cross-sectional view and a top view of an intermediate stage of method 300 in FIG. 2 according to an embodiment of the present disclosure, respectively. In operation 302, a photoresist layer 206 is formed on the mold 205. Then, the photoresist layer 206 undergoes a lithography process to form patterns. In some embodiments, a reticle or a fine metal mask that blocks ultraviolet (UV) radiation is placed over the photoresist layer 206. The photoresist layer 206 is then selectively exposed to UV radiation. Depending on whether positive or negative photoresist is employed, either exposed or unexposed portions of the photoresist layer 206 are rinsed by developing solution. As shown in FIG. 4A, the remaining photoresist layer 206 has patterns and can act as an etching mask in the following operation. The resultant patterns of the photoresist layer 206 are shown in FIG. 4B.

Figure 5A:
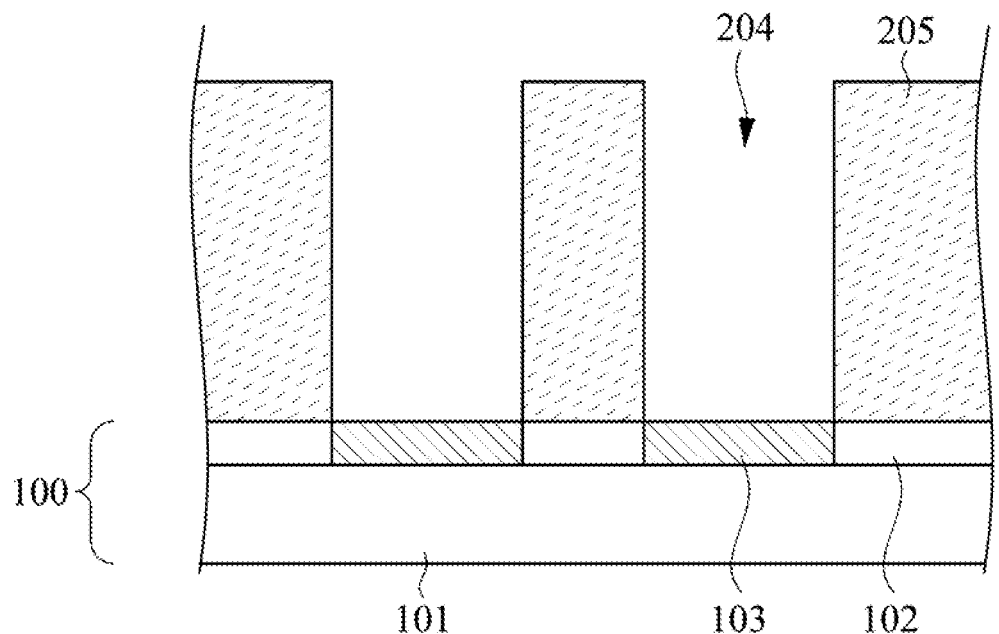
FIG. 5A is a partial cross-sectional view of an intermediate stage of a method according to an embodiment of the present disclosure.
Figure 5B:
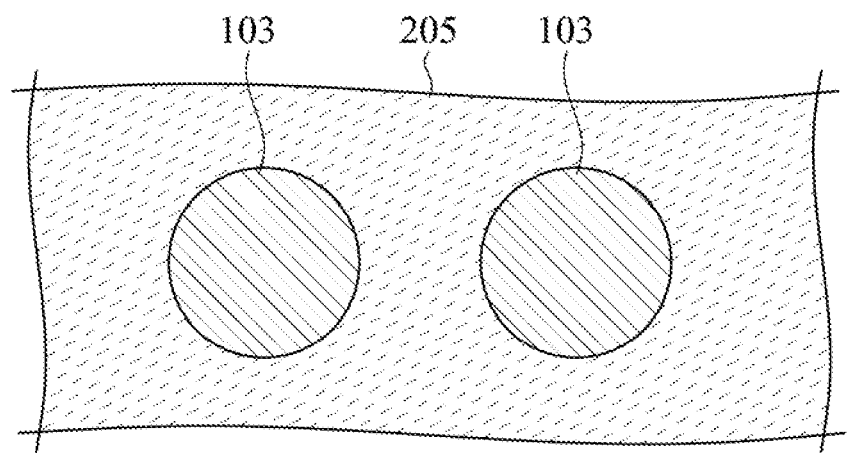
FIG. 5B is a top view of an intermediate stage of a method according to an embodiment of the present disclosure.

Reference is made to FIG. 5A and FIG. 5B. FIG. 5A and FIG. 5B are a partial cross-sectional view and a top view of an intermediate stage of method 300 in FIG. 2 according to an embodiment of the present disclosure, respectively. In operation 303, the mold 205 is etched through the photoresist layer 206 until a portion of the substrate 100 is exposed. For example, as shown in FIG. 5A and FIG. 5B, the surfaces of the contact pads 103 of the substrate 100 are exposed through the resultant opening 204. Later, the photoresist layer 206 is removed and the structure in FIG. 5A remains.

Figure 6A:
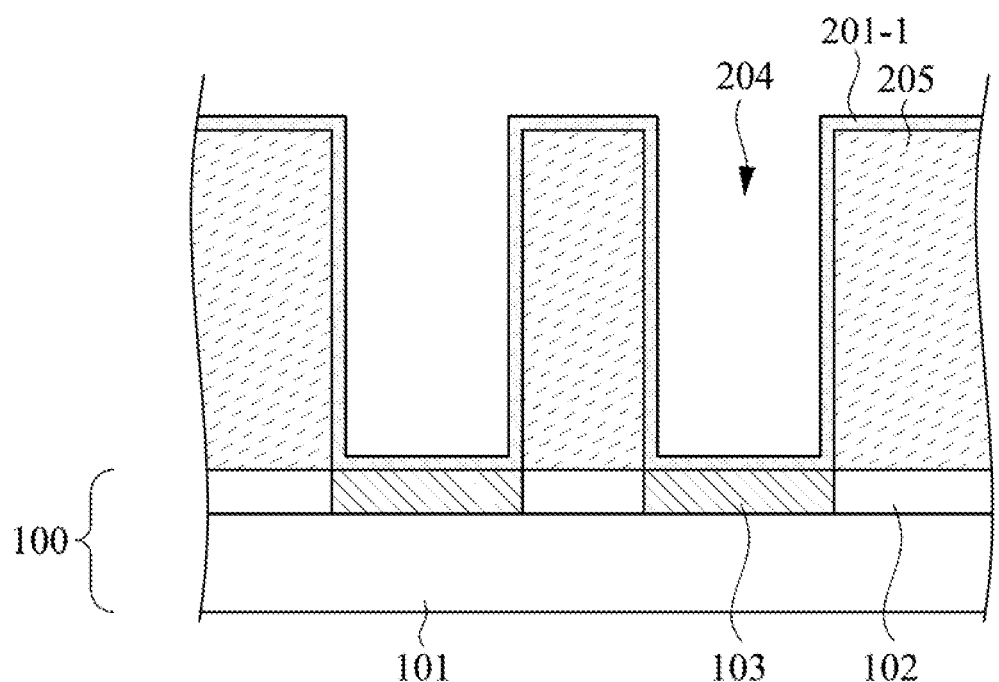
FIG. 6A is a partial cross-sectional view of an intermediate stage of a method according to an embodiment of the present disclosure.
Figure 6B:
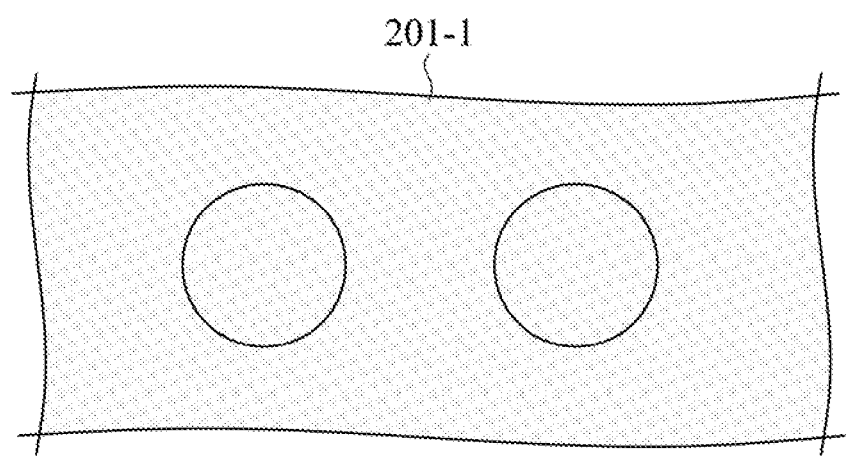
FIG. 6B is a top view of an intermediate stage of a method according to an embodiment of the present disclosure.

Reference is made to FIG. 6A and FIG. 6B. FIG. 6A and FIG. 6B are a partial cross-sectional view and a top view of an intermediate stage of method 300 in FIG. 2 according to an embodiment of the present disclosure, respectively. In operation 304, the first bottom electrode layer 201-1 is formed by stacking the TiN layers 201-1d and the SiN layers 201-1e alternately (referring to FIG. 1C). The TiN layers 201-1d and SiN layers 201-1e are deposited using atomic layer deposition (ALD), for example.

The thicknesses of the TIN layers 201-1d and the thicknesses of the SiN layers 201-1e are controlled through the number of ALD cycles. For example, to obtain the ratio of the thicknesses as shown in FIG. 1C, the structure in FIG. 5A undergoes 64 ALD cycles for TiN deposition, 2 ALD cycles for SiN deposition, then 4 ALD cycles for TiN deposition, 2 ALD cycles for SiN deposition, and finally 259 ALD cycles for TiN deposition. The resultant structure in FIG. 6A and FIG. 6B shows the first bottom electrode layer 201-1 disposed on the mold 205 and in the opening 204. Preferably, the SiN layers 201-1e are disposed close to the external surface 201a, so that the SiN layers 201-1e help prevent the oxidation of the external surface 201a.

Figure 7A:
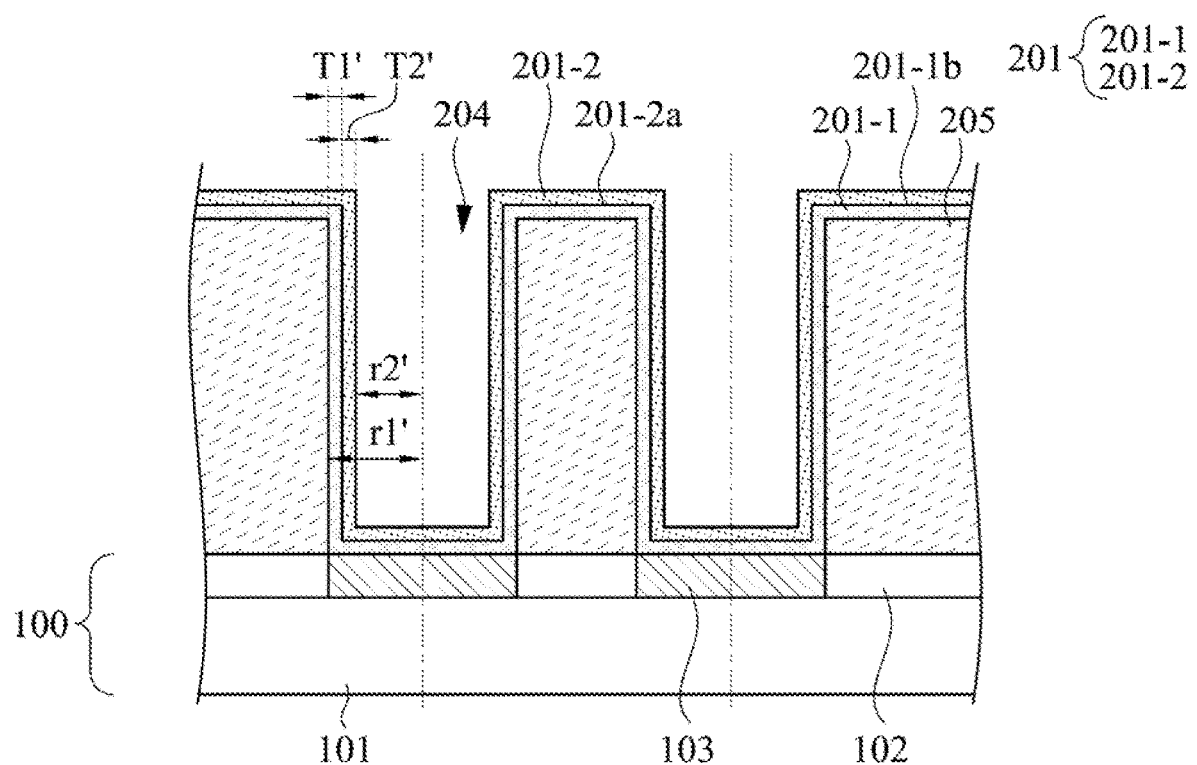
FIG. 7A is a partial cross-sectional view of an intermediate stage of a method according to an embodiment of the present disclosure.
Figure 7B:
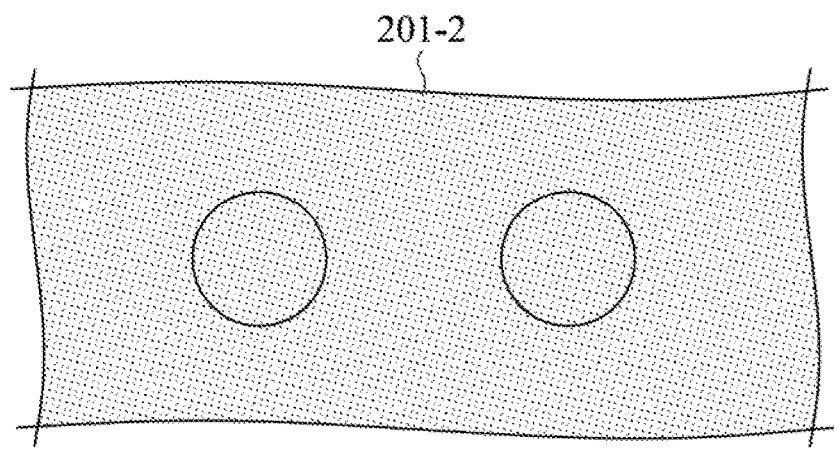
FIG. 7B is a top view of an intermediate stage of a method according to an embodiment of the present disclosure.

Reference is made to FIG. 7A and FIG. 7B. FIG. 7A and FIG. 7B are a partial cross-sectional view and a top view of an intermediate stage of method 300 in FIG. 2 according to an embodiment of the present disclosure, respectively. In operation 304, the second bottom electrode layer 201-2 is then formed using ALD, for example. In an exemplary embodiment, the second bottom electrode layer 201-2 includes TiN. Specifically, the structure in FIG. 6A undergoes 331 more ALD cycles for TiN deposition. The resultant structure in FIG. 7A shows the second bottom electrode layer 201-2 conformally covering the first bottom electrode layer 201-1. The first bottom electrode layer 201-1 and the second bottom electrode layer 201-2 are collectively referred to as the bottom electrode 201. As shown in FIG. 7A, the bottom electrode 201 has an outer radius r1'. The bottom electrode 201 has an outer radius r2'. After operation 304, the first bottom electrode layer 201-1 has a thickness T1'. The second bottom electrode layer 201-2 has a thickness T2'. In some embodiments, the ratio of the thickness T1' and the thickness T2' is in a range from about 0.3 to about 1.2.

Figure 8A:
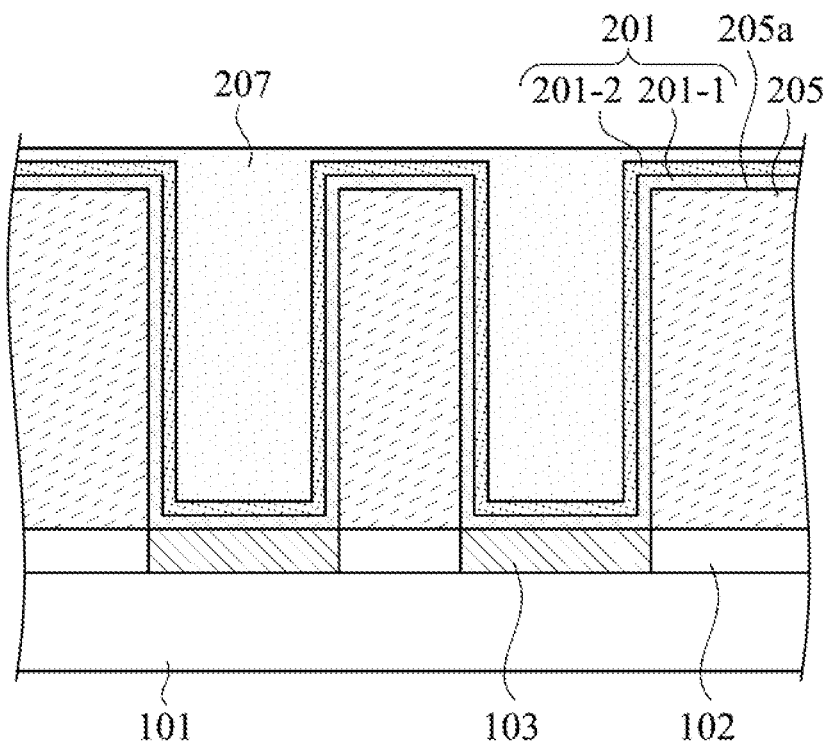
FIG. 8A is a partial cross-sectional view of an intermediate stage of a method according to an embodiment of the present disclosure.
Figure 8B:
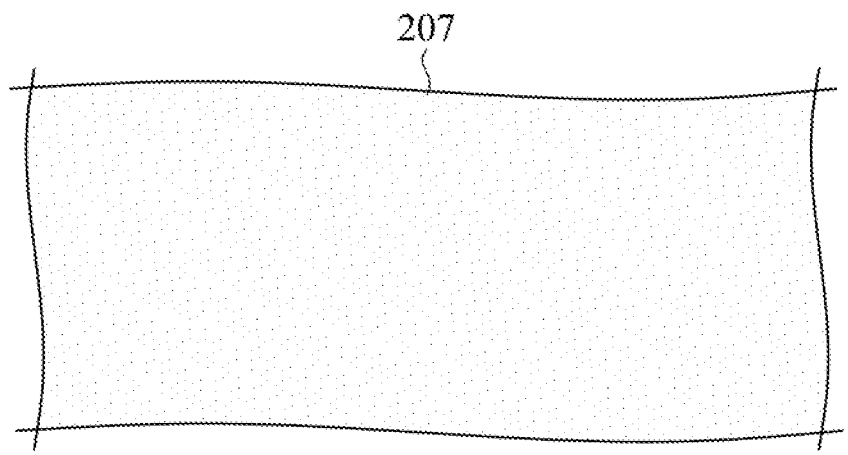
FIG. 8B is a top view of an intermediate stage of a method according to an embodiment of the present disclosure.
Figure 9A:
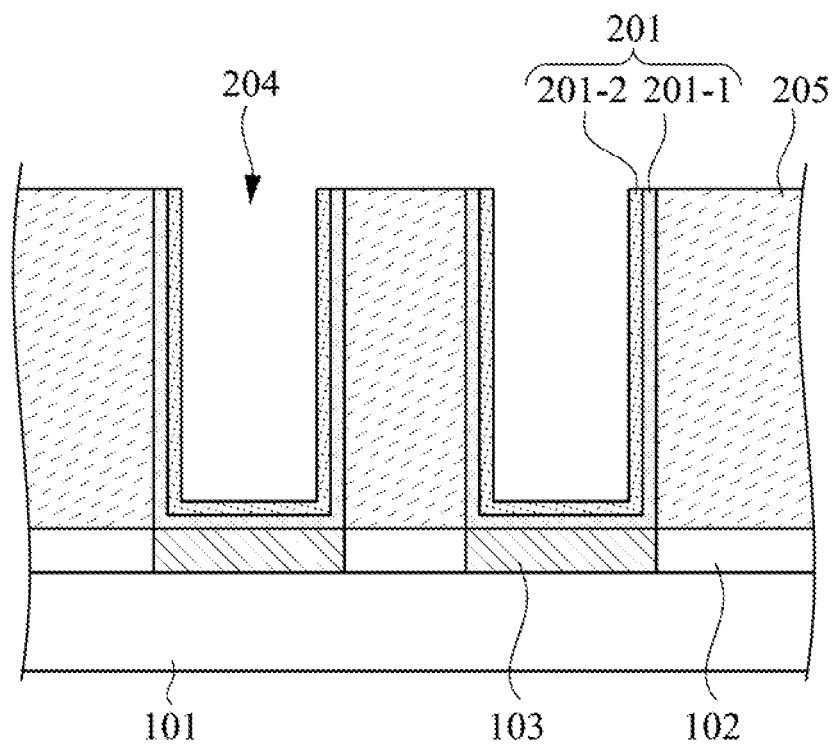
FIG. 9A is a partial cross-sectional view of an intermediate stage of a method according to an embodiment of the present disclosure.
Figure 9B:
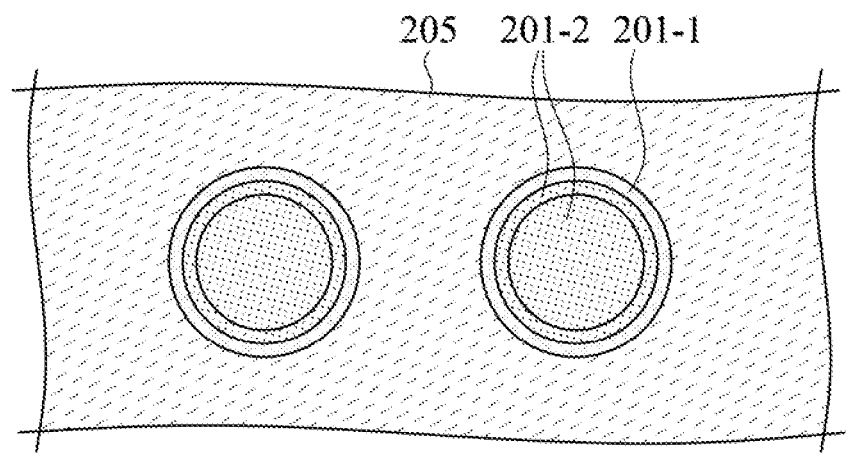
FIG. 9B is a top view of an intermediate stage of a method according to an embodiment of the present disclosure.

Reference is made to FIG. 8A, FIG. 8B, FIG. 9A, and FIG. 9B. FIG. 8A and FIG. 9A are partial cross-sectional views of intermediate stages of method 300 according to an embodiment of the present disclosure. FIG. 8B and FIG. 9B are top views of intermediate stages of method 300 according to an embodiment of the present disclosure. In some embodiments, method 300 may further include a planarization process to remove excess portions of the bottom electrode 201. To perform the planarization process, a protective layer 207, such as a photoresist substance, fills the opening 204 and covers the second bottom electrode layer 201-2, as shown in FIG. 8A and FIG. 8B. Then, the surface of the structure in FIG. 8A and FIG. 8B is planarized using an etch back or by performing a chemical mechanical polishing (CMP) process, for example. The planarization process is performed until the top surface 205a of the mold 205 is exposed. Next, the protective layer 207 is removed, and the structure in FIG. 9A and FIG. 9B remains.

Figure 10A:
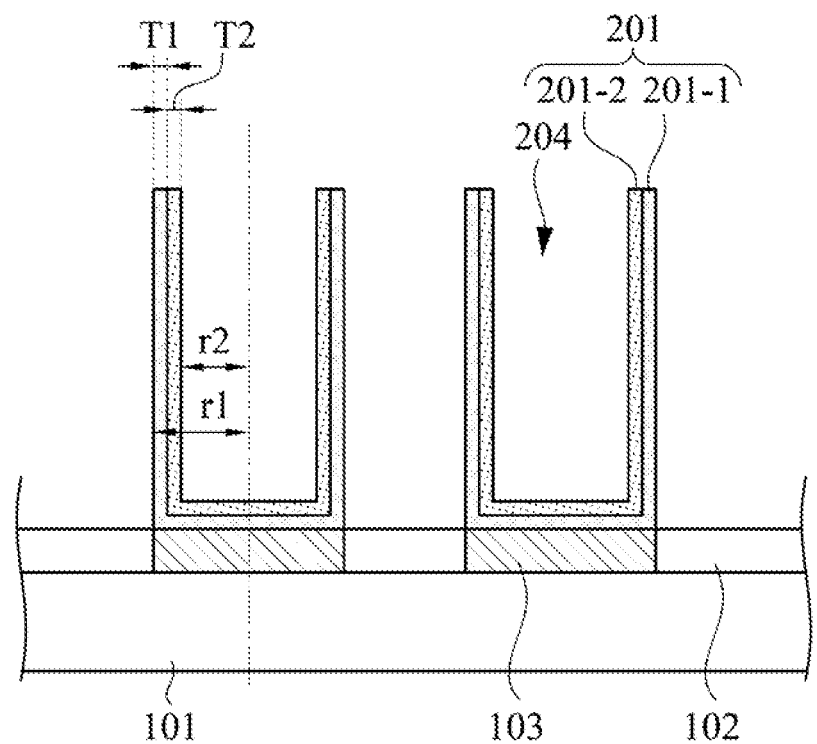
FIG. 10A is a partial cross-sectional view of an intermediate stage of a method according to an embodiment of the present disclosure.
Figure 10B:
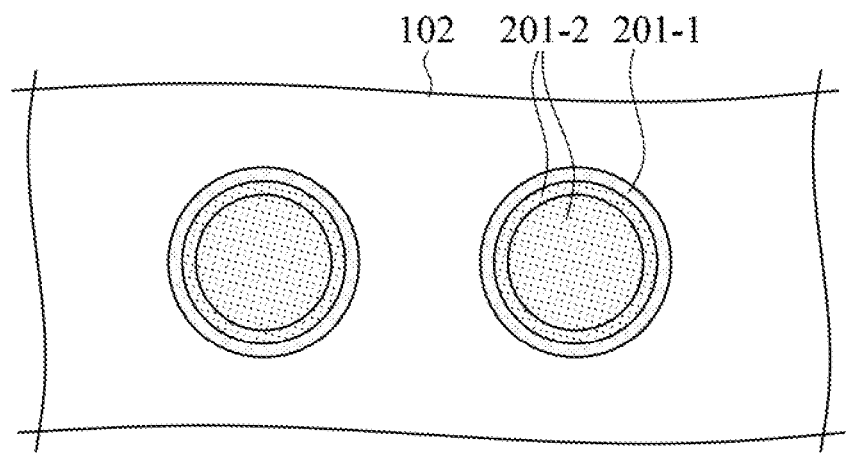
FIG. 10B is a top view of an intermediate stage of a method according to an embodiment of the present disclosure.

Reference is made to FIG. 10A and FIG. 10B. FIG. 10A and FIG. 10B are a partial cross-sectional view and a top view of an intermediate stage of method 300 in FIG. 2 according to an embodiment of the present disclosure, respectively. In operation 305, the mold 205 may be fully removed using a wet chemical, such as a hydrofluoric acid-based solution. During the removal of the mold 205, the bottom electrode 201 is more or less etched since TiN is easily oxidized and thus susceptible to etching. Therefore, the outer radius r1' of the bottom electrode 201 shown in FIG. 7A is etched into the outer radius r1 shown in FIG. 10A. The outer radius r1 is smaller than the outer radius r1'. Similarly, the inner radius r2' of the bottom electrode 201 shown in FIG. 7A is etched into the inner radius r2 shown in FIG. 10A. The inner radius r2 is larger than the inner radius r2'.

Also, the thickness T1' of the first bottom electrode layer 201-1 shown in FIG. 7A is etched into the thickness T1 shown in FIG. 10A. The thickness T1 is smaller than the thickness T1'. Similarly, the thickness T2' of the second bottom electrode layer 201-2 shown in FIG. 7A is etched into the thickness T2 shown in FIG. 10A. The thickness T2 is smaller than the thickness T2'. In some embodiments, the ratio of the thickness T1 and the thickness T2 is in a range from about 0.3 to about 1.2. For example, the ratio of the thickness T1 and the thickness T2 is about 1.

As described above, to achieve as large radii as possible, the first bottom electrode layer 201-1 includes a TiN—SiN nanostructure to increase its etch resistance. As such, the difference between the outer radius r1' and the outer radius r1 is smaller than the difference between the inner radius r2' and the inner radius r2. Similarly, the difference between the thickness T1' and the thickness T1 is smaller than the difference between the thickness T2' and the thickness T2.

Figure 11A:
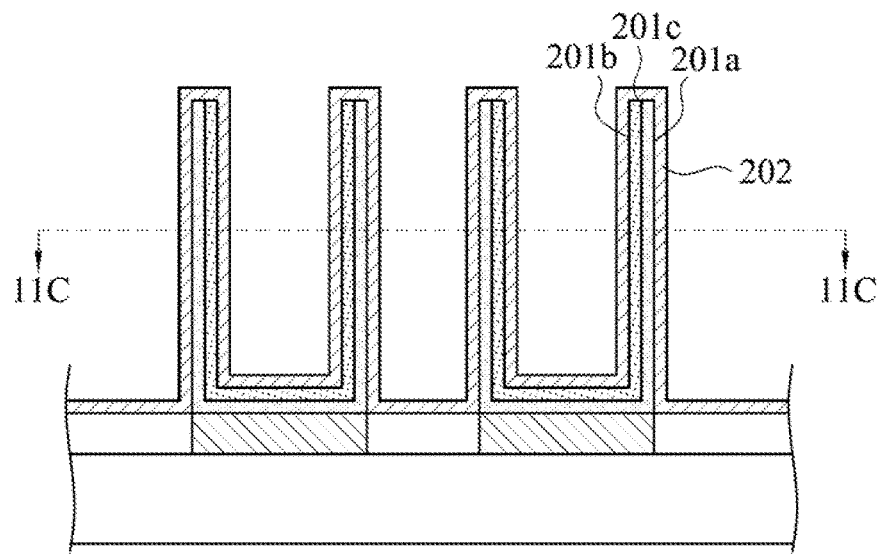
FIG. 11A is a partial cross-sectional view of an intermediate stage of a method according to an embodiment of the present disclosure.
Figure 11B:
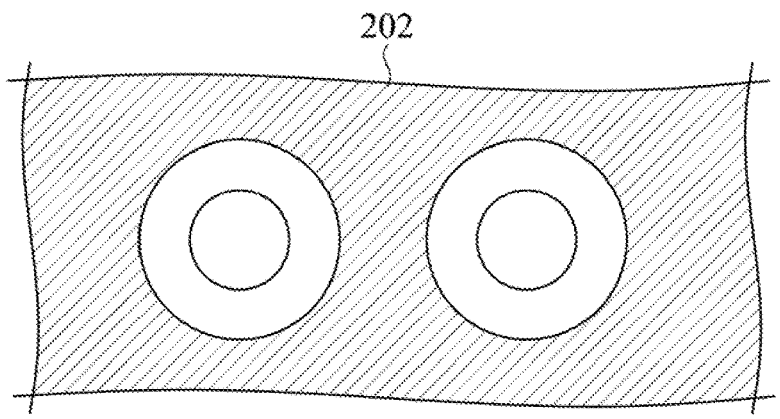
FIG. 11B is a top view of an intermediate stage of a method according to an embodiment of the present disclosure.
Figure 11C:
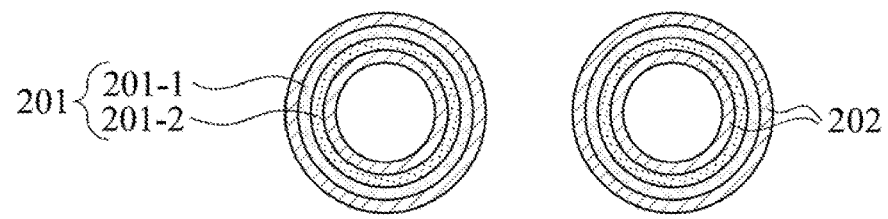
FIG. 11C is a partial cross-sectional view of an intermediate stage of a method taken along the line 11C-11C of FIG. 11A according to an embodiment of the present disclosure.

In some embodiments, method 300 further involves depositing a dielectric layer 202 conformally covering the internal surface 201b of the bottom electrode 201. In an exemplary embodiment, the depositing the dielectric layer 202 includes depositing the dielectric layer 202 conformally covering the top surface 201c and the external surface 201a of the bottom electrode 201. Reference is made to FIG. 11A, FIG. 11B, and FIG. 11C. FIG. 11A and FIG. 11B are a partial cross-sectional view and a top view of an intermediate stage of method 300 according to an embodiment of the present disclosure, respectively. As shown in FIG. 11A and FIG. 11B, the dielectric layer 202 conformally covers the external surface 201a, the internal surface 201b, and the top surface 201c of the bottom electrode 201. FIG. 11C is a partial cross-sectional view of an intermediate stage of method 300 taken along the line 11C-11C of FIG. 11A. As shown in FIG. 11C, the bottom electrode 201 is disposed in the dielectric layer 202 in the corresponding cross-section.

Figure 12A:
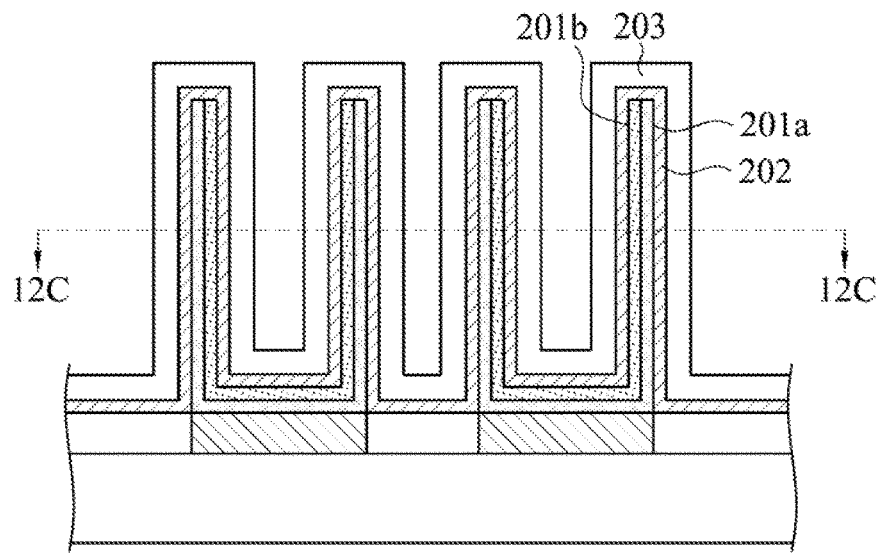
FIG. 12A is a partial cross-sectional view of an intermediate stage of a method according to an embodiment of the present disclosure.
Figure 12B:
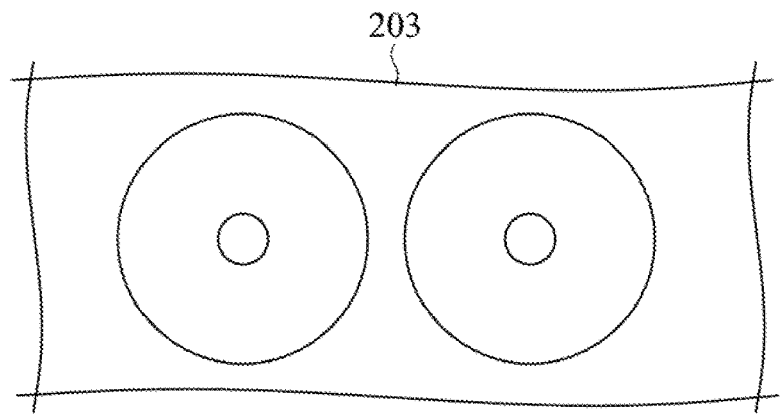
FIG. 12B is a top view of an intermediate stage of a method according to an embodiment of the present disclosure.
Figure 12C:
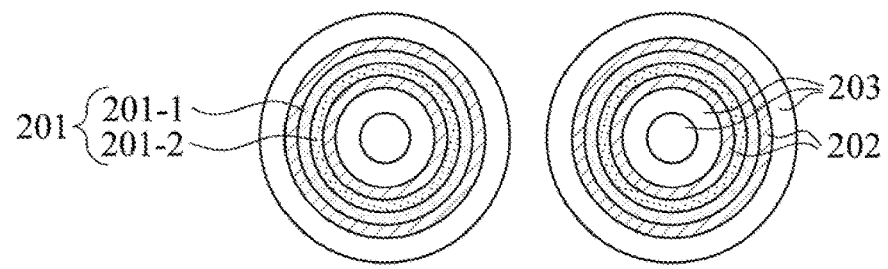
FIG. 12C is a partial cross-sectional view of an intermediate stage of a method taken along the line 12C-12C of FIG. 12A according to an embodiment of the present disclosure.

In some embodiments, method 300 further involves depositing a top electrode 203 conformally covering the dielectric layer 202. Reference is made to FIG. 12A, FIG. 12B, and FIG. 12C. FIG. 12A and FIG. 12B are a partial cross-sectional view and a top view of an intermediate stage of method 300 according to an embodiment of the present disclosure, respectively. FIG. 12C is a partial cross-sectional view taken along the line 12C-12C of FIG. 12A. In an exemplary embodiment, the depositing the dielectric layer 202 includes depositing the dielectric layer 202 conformally covering the top surface 201c and the external surface 201a of the bottom electrode 201. Later, the top electrode 203 is formed to conformally cover the dielectric layer 202. In this way, as shown in FIG. 12C, the bottom electrode 201 and the dielectric layer 202 are disposed in the top electrode 203 in the corresponding cross-section, which makes the intermediate structure in FIG. 12A, FIG. 12B, and FIG. 12C a double-sided MIM capacitor.

According to the foregoing recitations of the embodiments of the disclosure, it may be seen that in the capacitor and its fabricating method of the present disclosure, by adding SiN layers to the outer portion of the cup-shaped bottom electrode, the etch resistance of the outer portion is higher than that of the inner portion. Therefore, when undergoing etching processes during the fabrication, the outer radius of the bottom electrode remains and the inner radius of the bottom electrode increases. As such, the contact areas of the bottom electrode with the dielectric layer either remain at their maximum or increase. Hence, a capacitor with higher capacitance while maintaining the same leakage current may be accomplished.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A capacitor for a memory device, comprising:
   a substrate;
   a bottom electrode comprising:
      a first bottom electrode layer disposed on the substrate, having a U-shaped cross-sectional profile, and comprising a plurality of titanium nitride layers and a plurality of silicon nitride layers that are stacked alternately; and
      a second bottom electrode layer having a U-shaped cross-sectional profile and comprising titanium nitride, wherein an external surface of the second bottom electrode layer contacts an internal surface of the first bottom electrode layer;
   a dielectric layer conformally covering an internal surface of the second bottom electrode layer and in contact with the internal surface of the second bottom electrode layer; and
   a top electrode conformally covering the dielectric layer.

2. The capacitor of claim 1, wherein the dielectric layer further conformally covers a top surface and an external surface of the bottom electrode.

3. The capacitor of claim 1, wherein the top electrode conformally covers a top surface and an external surface of the bottom electrode.

4. The capacitor of claim 1, wherein the top electrode comprises titanium nitride.

5. The capacitor of claim 1, wherein a ratio of a thickness of the first bottom electrode layer and a thickness of the second bottom electrode layer is in a range from about 0.3 to about 1.2.

6. The capacitor of claim 1, wherein a total thickness of the plurality of titanium nitride layers of the first bottom electrode layer is larger than a total thickness of the plurality of silicon nitride layers of the first bottom electrode layer.

7. The capacitor of claim 1, wherein one of the plurality of titanium nitride layers of the first bottom electrode layer is disposed between and in contact with two of the silicon nitride layers of the first bottom electrode layer.

* * * * *